United States Patent
Liu (10) Patent No.: US 12,176,254 B2
(45) Date of Patent: Dec. 24, 2024

(54) PID TEST STRUCTURE AND SEMICONDUCTOR TEST STRUCTURE

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 754 days.

(21) Appl. No.: 17/380,158

(22) Filed: Jul. 20, 2021

(65) Prior Publication Data

US 2021/0351090 A1 Nov. 11, 2021

Related U.S. Application Data

(63) Continuation of application No. PCT/CN2021/079625, filed on Mar. 9, 2021.

(30) Foreign Application Priority Data

Apr. 7, 2020 (CN) .......................... 202010264453.0

(51) Int. Cl.
*H01L 21/66* (2006.01)
*H01L 29/423* (2006.01)

(52) U.S. Cl.
CPC .......... *H01L 22/32* (2013.01); *H01L 29/4238* (2013.01)

(58) Field of Classification Search
CPC ............ C23C 16/45536; C23C 16/402; H10B 12/033; G01R 31/2621; G01R 31/2818; G01R 31/2831; G01R 31/2884; G01R 31/2856; G01R 29/10; G01R 31/2858; H01L 22/34; H01L 21/76877; H01L 23/5226; H01L 21/76802; H01L 27/0266; H01L 29/78; H01L 21/823871; H01L 23/522; H01L 23/528; H01L 21/02274; H01L 21/76829; H01L 21/76885;
(Continued)

(56) References Cited

U.S. PATENT DOCUMENTS

| 6,075,292 | A | * | 6/2000 | Noguchi | ................. | H01L 23/60 |
| | | | | | | 257/750 |
| 7,875,936 | B2 | * | 1/2011 | Magri | ................. | H01L 29/4933 |
| | | | | | | 257/E29.256 |

(Continued)

FOREIGN PATENT DOCUMENTS

| CN | 102034816 A | 4/2011 |
| CN | 107024522 A | 8/2017 |

(Continued)

OTHER PUBLICATIONS

International Search Report in the international application No. PCT/CN2021/079625, mailed on Jun. 1, 2021, 2 pgs.

*Primary Examiner* — Mark W Tornow
*Assistant Examiner* — Priya M Rampersaud
(74) *Attorney, Agent, or Firm* — Syncoda LLC; Feng Ma (57) ABSTRACT

Provided is a Plasma Induced Damage (PID) test structure and a semiconductor test structure, including: a gate structure, including a gate layer; a covering dielectric layer, located on a surface of the gate layer; a metal layer structure, located on a surface of the covering dielectric layer, the metal layer structure including at least one metal layer; and an extraction electrode, electrically connected with the gate layer via a conductive structure.

1 Claim, 8 Drawing Sheets

(58) Field of Classification Search
CPC ....... H01L 21/823475; H01L 23/53238; H01L 23/53295; H01L 23/562; H01L 28/90; H01L 29/42364; H01L 29/495; H01L 29/4966; H01L 21/02164; H01L 21/02178; H01L 21/02315; H01L 21/3065; H01L 21/76224; H01L 21/768; H01L 21/76826; H01L 21/76832; H01L 21/76834; H01L 23/485; H01L 23/5221; H01L 23/5283; H01L 27/0251; H01L 28/91; H01L 29/40114; H01L 29/4238; H01L 2924/13091; H01L 22/32; H01L 23/544; H01L 29/4925

See application file for complete search history.

(56) References Cited

U.S. PATENT DOCUMENTS

| | | | |
|---|---|---|---|
| 8,519,394 B2 | 8/2013 | Miyairi | |
| 10,079,187 B2 | 9/2018 | Beckmeier et al. | |
| 10,385,377 B2 | 8/2019 | Takechi et al. | |
| 10,538,800 B2 | 1/2020 | Takechi et al. | |
| 2003/0008450 A1* | 1/2003 | Tsai | H01L 21/7681 257/E21.507 |
| 2006/0115911 A1* | 6/2006 | Itou | H01L 22/14 257/E21.531 |
| 2009/0121322 A1* | 5/2009 | Ozawa | H01L 23/3171 438/622 |
| 2011/0215393 A1* | 9/2011 | Yang | H01L 21/266 438/266 |
| 2011/0220905 A1 | 9/2011 | Miyairi | |
| 2012/0295412 A1* | 11/2012 | Wang | H01L 29/66545 257/E21.409 |
| 2014/0252621 A1* | 9/2014 | Lin | H01L 21/76846 438/586 |
| 2017/0082570 A1 | 3/2017 | Takechi et al. | |
| 2017/0316991 A1* | 11/2017 | Beckmeier | H01L 22/34 |
| 2019/0330674 A1 | 10/2019 | Takechi et al. | |
| 2020/0203335 A1* | 6/2020 | Park | G01R 31/2621 |

FOREIGN PATENT DOCUMENTS

| | | |
|---|---|---|
| CN | 206422042 U | 8/2017 |
| CN | 107452715 A | 12/2017 |

* cited by examiner

PID TEST STRUCTURE AND SEMICONDUCTOR TEST STRUCTURE

CROSS-REFERENCE TO RELATED APPLICATION

This is a continuation application of International Patent Application No. PCT/CN2021/079625, filed on Mar. 9, 2021, which claims priority to Chinese patent application No. 202010264453.0, filed on Apr. 7, 2020 and entitled "PID TEST STRUCTURE AND SEMICONDUCTOR TEST STRUCTURE". The disclosures of International Patent Application No. PCT/CN2021/079625 and Chinese patent application No. 202010264453.0 are incorporated by reference herein in their entireties.

TECHNICAL FIELD

The present disclosure relates to the technical field of an integrated circuit, and more particularly, to a PID test structure and a semiconductor test structure.

BACKGROUND

In a deep submicron integrated circuit process, High Density Plasma Enhanced Deposition (HDPECVD) and plasma etching technologies are generally used frequently. However, in a high density plasma enhanced deposition or plasma etching procedure, free charges are generated, and when a conductor (metal or polysilicon) is etched, an exposed conductor surface may collect the free charges. If the conductor on which the charges are accumulated is directly connected to a gate of a device, a gate leakage current may be formed in a thin oxide layer under a polysilicon gate. When the accumulated charges exceed a certain number, the gate oxide layer may be damaged and cause circuit failures, which will result in that the reliability and the service life of the device and even a whole chip are seriously reduced. Generally, this situation is referred to as Plasma Induced Damage (PID), and is also referred to as Process Antenna Effect (PAE).

Generally, the probability of the process antenna effect occurring on a chip can be evaluated by the antenna ratio. The definition of the antenna ratio is: the ratio of the area of a conductor (typically metal) constituting a so-called "antenna" to the area of the gate oxide layer. The gate oxide layer is generally used as a test object in a PID test in related technologies. In order to ensure an electrical characteristic of the device, the gate oxide layer cannot be too thin and must have certain thickness, and the thickness of the gate oxide layer cannot be adjusted randomly. A thicker gate oxide layer is not sensitive to PID damage monitoring, so that the test is not timely and accurate enough when the gate oxide layer is used as the test object in the PID test. Meanwhile, when the gate oxide layer is used as the test object, a gate layer serves as one electrode plate and a substrate needs to serve as the other electrode plate, so that ohmic contact needs to be performed in an active region of the substrate, that is, it require occupancy of the area of the active region, so that there is a problem that contact resistance of the test structure is high and the test is not sensitive enough.

SUMMARY

A first aspect of the present disclosure provides a Plasma Induced Damage (PID) test structure, including: a gate structure, a covering dielectric layer, a metal layer structure and an extraction electrode.

The gate structure includes a gate layer.

The covering dielectric layer is located on a surface of the gate layer, and the covering dielectric layer is a PID test object.

The metal layer structure is located on a surface of the covering dielectric layer, and the metal layer structure includes at least one metal layer.

The extraction electrode is electrically connected with the gate layer through a conductive structure.

According to the first aspect of the present disclosure, in the PID test structure, the test object is the covering dielectric layer on the top of the gate structure. Since the thickness of the covering dielectric layer does not affect the performance of a device, the thickness of the covering dielectric layer may be set according to actual requirements, and thus there are more design options. Moreover, the covering dielectric layer has higher ability to capture a free charge, so that the PID test structure may have higher sensitivity, and the timeliness and the accuracy of the test can be ensured. In the above PID test structure, the metal layer and the gate layer serve as two electrode plates, and a substrate does not need to serve as the electrode plate, so that the PID test structure may be arranged on a surface of a shallow trench isolating structure of the substrate. As such, the area of an active region in the substrate is not occupied, and the utilization rate of the substrate can be improved.

In a second aspect of the present disclosure, a semiconductor structure is provided. The semiconductor structure includes a plurality of PID test structures according to the first aspect of the present disclosure, and a metal layer with the largest area in one PID test structure is located at a different level from a metal layer with the largest area in another PID test structure.

BRIEF DESCRIPTION OF THE DRAWINGS

For a better description and illustration of embodiments of the present disclosure, reference may be made to one or more of the accompanying drawings, but the additional details or examples used to describe the drawings should not be construed as limiting the scope of any one of inventions and innovations, currently described embodiments, or preferred modes of the present disclosure.

DETAILED DESCRIPTION

To facilitate an understanding of the present disclosure, the present disclosure will be described below in detail with reference to the accompanying drawings. Preferred embodiments of the present disclosure are illustrated in the accompanying drawings. However, the present disclosure may be embodied in many different forms and should not be construed as limited to the embodiments set forth herein. Rather, these embodiments are provided so that the present disclosure will be thorough and complete.

It is be noted that when an element is referred to as being "connected" to another element, it may be directly connected to and integrated with the other element, or an intervening element may be present. The terms "mounted", "one end", "another end", and the like are used herein for illustrative purposes only.

Unless defined otherwise, all technical and scientific terms used herein have the same meaning as commonly understood by those of ordinary skill in the art to which the present disclosure belongs. The terms used herein in the specification of the present disclosure are for the purpose of describing specific embodiments only and are not intended to be limiting of the present disclosure. As used herein, the term "and/or" includes any and all combinations of one or more of the associated listed items.

Figure 1:
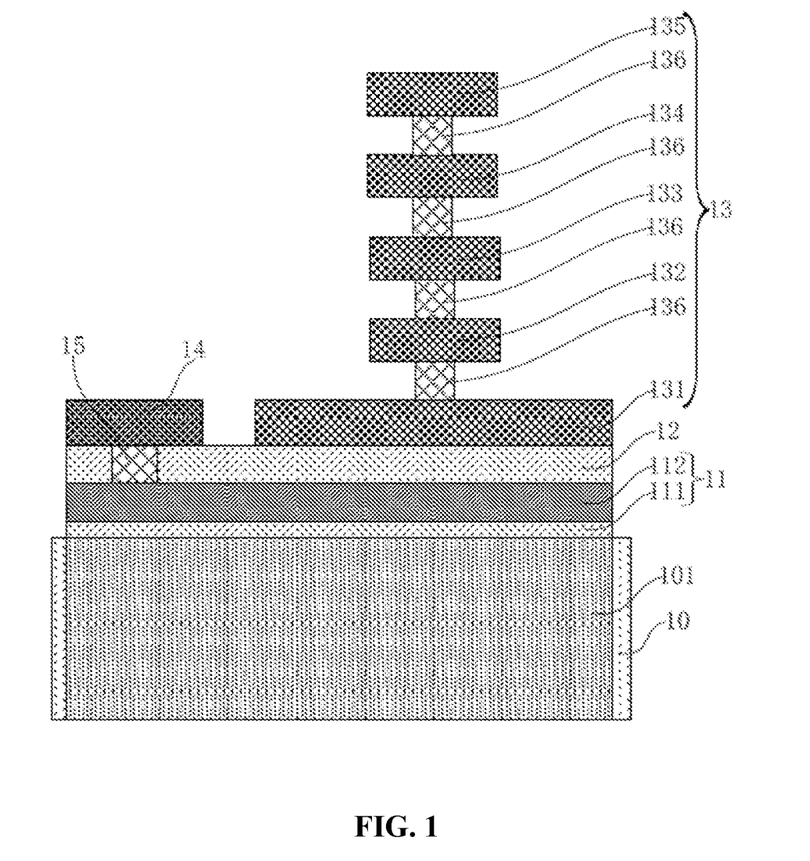
FIG. 1 is a schematic cross-sectional view of a PID structure according to a first embodiment of the present disclosure.

In a first embodiment, as shown in FIG. 1, the present disclosure provides a PID test structure, including: a gate structure 11 including a gate layer 112; a covering dielectric layer 12 which is located on a surface of the gate layer 112 and is a PID test obj ect; a metal layer structure 13 which is located on a surface of the covering dielectric layer 12 and includes at least one metal layer; and an extraction electrode 14 electrically connected with the gate layer 112 via a conductive structure 15.

In the PID test structure, the test object is the covering dielectric layer 12 on the top of the gate structure 11. Since the thickness of the covering dielectric layer 12 does not affect the performance of a device, the thickness of the covering dielectric layer 12 may be set according to actual requirements, and thus there are more design options. Moreover, the covering dielectric layer 12 has higher ability to capture a free charge, so that the PID test structure may have higher sensitivity, and the timeliness and the accuracy of the test can be ensured. In the above PID test structure, the metal layer and the gate layer 112 serve as two electrode plates, and a substrate does not need to serve as the electrode plate, so that the PID test structure may be arranged on a surface of a shallow trench isolating structure of the substrate. As such, the area of an active region in the substrate is not occupied, and the utilization rate of the substrate can be improved.

In one example, the thickness of the covering dielectric layer 12 may be set according to a practical requirement, for example, the thickness of the covering dielectric layer 12 may be 100 Å (angstrom) to 1000 Å; preferably, the thickness of the covering dielectric layer 12 may be 300 Å to 500 Å; and in particular, the thickness of the covering dielectric layer 12 may be 300 Å, 350 Å, 400 Å, 450 Å or 500 Å.

In one example, material of the covering dielectric layer 12 may be at least one of a silicon nitride layer, a silicon oxynitride layer, a silicon oxide layer, or other low-k (dielectric constant) layer, that is, the covering dielectric layer 12 may be the silicon nitride layer, the silicon oxynitride layer, the silicon oxide layer or the other low-k dielectric layer, and may also be a stack structure of at least two of the silicon nitride layer, the silicon oxynitride layer, the silicon oxide layer or the other low-k dielectric layer. In one example, the covering dielectric layer 12 may be the silicon nitride layer or the silicon oxynitride layer. The silicon nitride layer and the silicon oxynitride layer have higher ability to capture a free charge, and may have higher sensitivity than the covering dielectric layer 12 in the form of the silicon oxide layer. In one example, the covering dielectric layer 12 may be a stack structure including the silicon oxide layer, the silicon nitride layer and the silicon oxide layer which are sequentially stacked, or a stack structure including the silicon nitride layer, the silicon oxide layer and the silicon nitride layer which are sequentially stacked. Since a thicker silicon nitride layer causes large residual stress while a too thin silicon nitride layer makes parasitic capacitance of upper and lower conductive layers (the lower metal layer 131 and the gate layer 112) too high, the covering dielectric layer 12 is configured to be the stack structure including the silicon oxide layer, the silicon nitride layer and the silicon oxide layer or the stack structure including the silicon nitride layer, the silicon oxide layer and the silicon nitride layer. In this way, the thickness of the silicon nitride layer may be reduced to reduce the residual stress, while the thickness of the covering dielectric layer 12 may be ensured to reduce the parasitic capacitance of the upper and lower conductive layers. In particular, the silicon nitride layer and the silicon oxide layer in the covering dielectric layer 12 may be formed by a Plasma Enhanced Deposition (PECVD) process, and the silicon nitride layer or the silicon oxide layer formed by the PECVD process has poorer film-forming quality and is easier to capture a free charge. The growth pressure in the PECVD process cannot be too high or too low. When the growth pressure is too high, the covering dielectric layer 12 grows too fast, and the quality of the covering dielectric layer 12 is poorer. When the growth pressure is too low, the covering dielectric layer 12 grows too slowly, a growth period is longer, and the production efficiency is lower. In particular, in the embodiment, the growth pressure may be 1 Torr-10 Torr. More particularly, the growth pressure may be 1 Torr, 5 Torr, 10 Torr, or the like. Similarly, the growth temperature in the PECVD process cannot be too high or too low. When the growth temperature is too high, the covering dielectric layer 12 grows too fast, and the quality of the covering dielectric layer 12 is poorer. When the growth temperature is too low, the covering dielectric layer 12 grows too slowly, the growth period is longer, and the production efficiency is lower. In particular, in the present embodiment, the growth temperature may be 300° C.-500° C. More, particularly, the growth temperature may be 300° C., 400° C., or 500° C., or the like.

In one alternative example, the gate layer 112 may include a gate polysilicon layer (not shown), and a gate metal layer (not shown). The gate metal layer is located on a surface of the gate polysilicon layer. The covering dielectric layer 12 is located on a surface of the gate metal layer. The extraction electrode 14 is electrically connected with the gate metal layer via the conductive structure 15. In the above example, the gate layer 112 is designed to be a structure including the gate polysilicon layer and the gate metal layer, and the extraction electrode 14 is electrically connected with the gate layer 112 via the conductive structure 15. Since resistance of metal is very low, resistance of the test structure may be significantly reduced, and the sensitivity of the PID test structure may be improved.

In another alternative example, the gate layer 112 may include the gate metal layer, that is, the gate layer 112 is a metal gate layer. In the above example, the gate layer 112 is designed as the gate metal layer, since the resistance of metal is very low, the resistance of the test structure may be significantly reduced, and the sensitivity of the PID test structure may be improved.

In yet another alternative example, the gate layer 112 may also be a polysilicon layer.

It is to be noted that the polysilicon layer or the gate polysilicon layer in the gate layer 112 in the above example is a doped polysilicon layer.

In one example, the PID test structure is located on the surface of the substrate 10, and the gate structure 11 is located on the surface of the substrate 10.

In one example, the gate structure 11 further includes a gate oxide layer 111, the gate oxide layer 111 is located on a surface of the substrate 10, the gate layer 112 is located on a surface of the gate oxide layer 111. In other examples, the gate oxide layer 111 may not be present.

In one example, the substrate 10 may include, but is not limited to, a silicon substrate.

In one example, the thickness of the gate oxide layer 111 may be set according to actual requirements, preferably, the thickness of the gate oxide layer 111 may be between 1 nm-5 nm, and in particular, the thickness of the gate oxide layer 111 may be 1 nm, 2 nm, 3 nm, 4 nm or 5 nm.

In one example, the thickness of the metal layer may be set according to actual requirements, preferably, the thickness of the metal layer may be between 400 Å-500 Å, and specifically, the thickness of a metal layer may be 400 Å, 450 Å or 500 Å.

In one example, the thickness of the gate layer 112 may be set according to actual requirements, preferably, the thickness of the gate layer 112 may be between 500-1500 Å, more preferably, the thickness of the gate layer 112 may be between 700 Å-1000 Å, and in particular, the thickness of the gate layer 112 may be 700 Å, 800 Å, 900 Å or 1000 Å.

In one example, the substrate 10 has a shallow trench isolating structure 101 therein, the shallow trench isolating structure 101 defines a plurality of active regions (not shown) spaced apart from each other in the substrate 10. The plurality of active regions may be arranged in an array. Two adjacent rows of active regions may be arranged in a one-to-one correspondence manner or may be arranged in a staggered manner. The PID test structure may be located on a surface of the shallow trench isolating structure 101, and in particular, the gate structure 11, the covering dielectric layer 12 and the metal layer structure 13 are all located on the surface of shallow trench isolating structure 101. The PID test structure may be arranged on the surface of the shallow trench isolating structure of the substrate, so that the area of the active region in the substrate is not occupied, and the utilization rate of the substrate may be improved.

In one example, the metal layer structure 13 may include a plurality of metal layers, the plurality of metal layers are sequentially stacked at intervals in a vertical direction, and an area of one of the plurality of metal layers is greater than that of the other metal layer of the plurality of metal layers. The lowermost metal layer is located on the surface of the covering dielectric layer, and the adjacent metal layers are electrically connected to each other via a conductive plug 136. Since the metal layer may collect the free charge, and since the larger the area of the metal layer is, the higher the ability of the metal layer to collect the free charge is (that is, the metal layer with the larger area collects more free charges), a certain specific metal layer (that is, the metal layer needing to be measured is set to be the metal layer with the largest area) may be measured by setting the area of one metal layer to be greater than that of the other metal layer.

Figure 2:
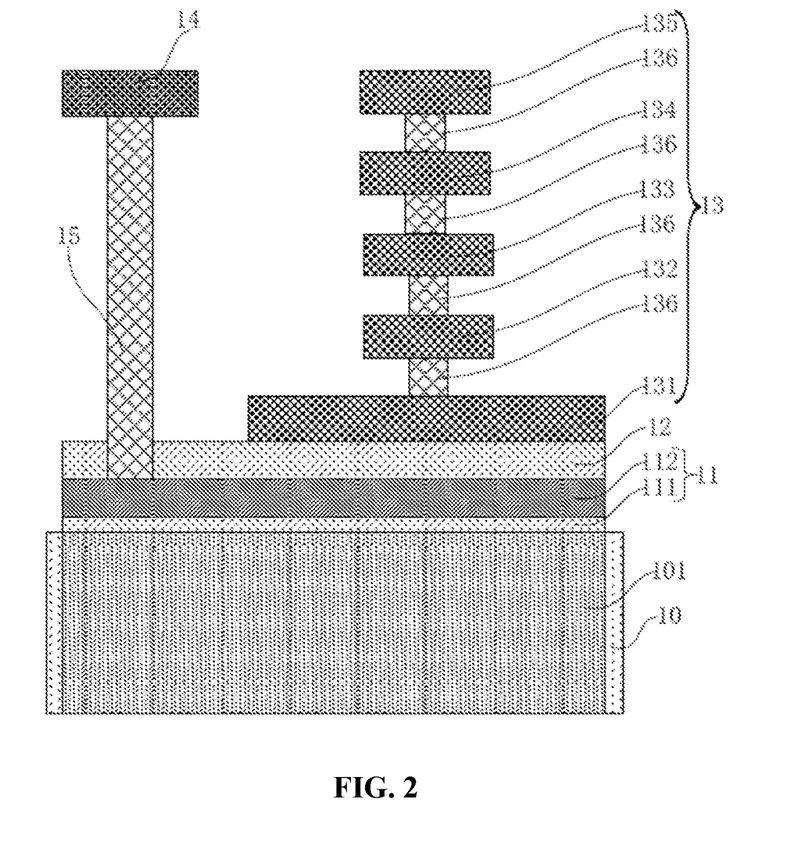
FIG. 2 is a schematic cross-sectional view of a PID structure according to a second embodiment of the present disclosure.
Figure 3:
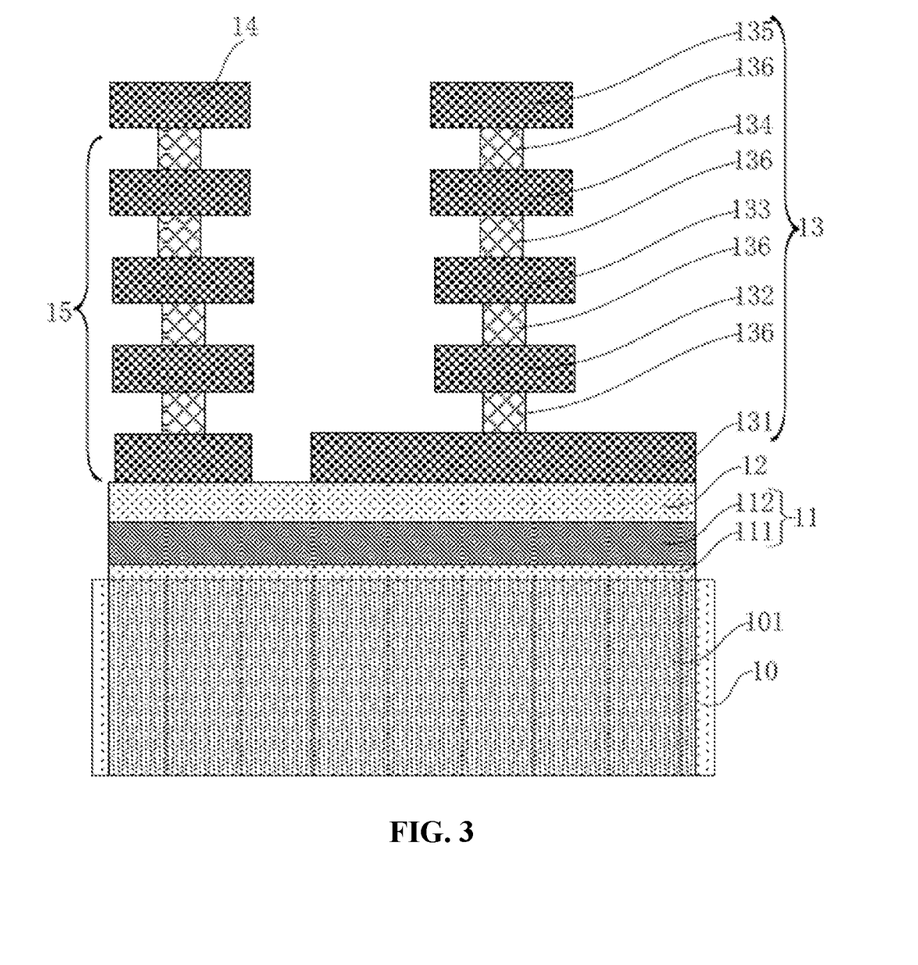
FIG. 3 is a schematic cross-sectional view of a PID structure according to a third embodiment of the present disclosure.

In particular, in the examples in FIG. 1 to FIG. 3, the metal layer structure 13 includes five metal layers, that is, the metal layer structure 13 in FIG. 1 may include a lowermost metal layer 131, a first metal layer 132, a second metal layer 133, a third metal layer 134, and a fourth metal layer 135. The lowermost metal layer 131, the first metal layer 132, the second metal layer 133, the third metal layer 134 and the fourth metal layer 135 are sequentially stacked at intervals from bottom to top. The conductive plug 136 is provided between the adjacent metal layers. At this time, the lowermost metal layer 131 is located on the surface of the covering dielectric layer 12. It should be noted that the specific number of the metal layers in the metal layer structure 13 may be set according to an actual requirement, for example, two, three, four, six, seven, or even more metal layers are provided.

It is to be noted that an intermediate dielectric layer (not shown) is provided between the adjacent metal layers, and the conductive plug 136 is located in the intermediate dielectric layer.

It is to be further noted that FIG. 1 illustrates that the area of the lowermost metal layer 131 is greater than that of the other metal layer (that is, the first metal layer 132, the second metal layer 133, the third metal layer 134 and the fourth metal layer 135). In other examples, the area of the metal layer other than the lowermost metal layer may be greater than that of the other metal layer, for example, the area of the first metal layer 132 may be greater than that of the other metal layer (such as, a fourth embodiment shown in FIG. 4), the area of the second metal layer 133 may be greater than that of the other metal layer (such as, a fifth embodiment shown in FIG. 5), the area of the third metal layer 134 may be greater than that of the other metal layer (such as, a sixth embodiment shown in FIG. 6), or the area of the fourth metal layer 135 (the uppermost one of the metal layers) may be greater than that of the other metal layer (such as, a seventh embodiment shown in FIG. 7).

In one example, the area of the metal layer with the largest area may be 1-20 times the area of the other metal layer, and in particular, the area of the metal layer with the largest area may be 1, 2, 3, 4, 5, 10, 15 or 20 times the area of the other metal layer.

It is to be noted that, as shown in FIG. 1, the areas of the other metal layers may be the same except for the lowermost metal layer 131 with the largest area.

In one example, the conductive structure 15 may be a conductive pillar structure located between the extraction electrode 14 and the gate layer 112 as shown in FIG. 2. In a third embodiment shown in FIG. 3, the conductive structure may also be a structure including a plurality of metal layers and conductive plugs located between the adjacent metal layers. At this time, each metal layer in the conductive structure 15 may be arranged in one-to-one correspondence with each metal layer in the metal layer structure 13, and the conductive plug in the conductive structure 15 may be arranged in one-to-one correspondence with the conductive plug in the metal layer structure 13.

In one example, the extraction electrode 14 may be located at the same level as the metal layer with the largest area. FIG. 1 is taken as an example, the extraction electrode 14 may be located at the same level as the lowermost metal layer 131, that is, the extraction electrode 14 may be formed based on the same metal process as the lowermost metal layer 131. In this case, the conductive structure 15 is located in the covering dielectric layer 12 and passes through the covering dielectric layer 12 along a thickness direction of the covering dielectric layer. However, the extraction electrode 14 needs to be spaced from the metal layer at the same level as the extraction electrode so as to ensure that they are insulated. In other examples, in order to facilitate an electrical extraction, the extraction electrode 14 may always be at the same level as the uppermost metal layer, that is, in FIG. 2, the extraction electrode 14 may also be at the same level as the fourth metal layer 135. At this time, the metal layer with the largest area may be located below the uppermost metal layer. In particular, the metal layer with the largest area may be any layer below the uppermost metal layer, and is not limited to the lowermost metal layer as shown in FIG. 2. At this time, the first metal layer 132, the second metal layer 133 or the third metal layer 134 may also be the metal layer with the largest area.

In another embodiment, referring to FIG. 1 to FIG. 8, the present disclosure further provides a semiconductor test structure. The semiconductor test structure includes a plurality of PID test structures including a metal layer structure 13 that includes a plurality of metal layers, as described in the embodiments above. The metal layer with the largest area in each PID test structure is located at a different level from the metal layer with the largest area in the other PID test structures.

Figure 4:
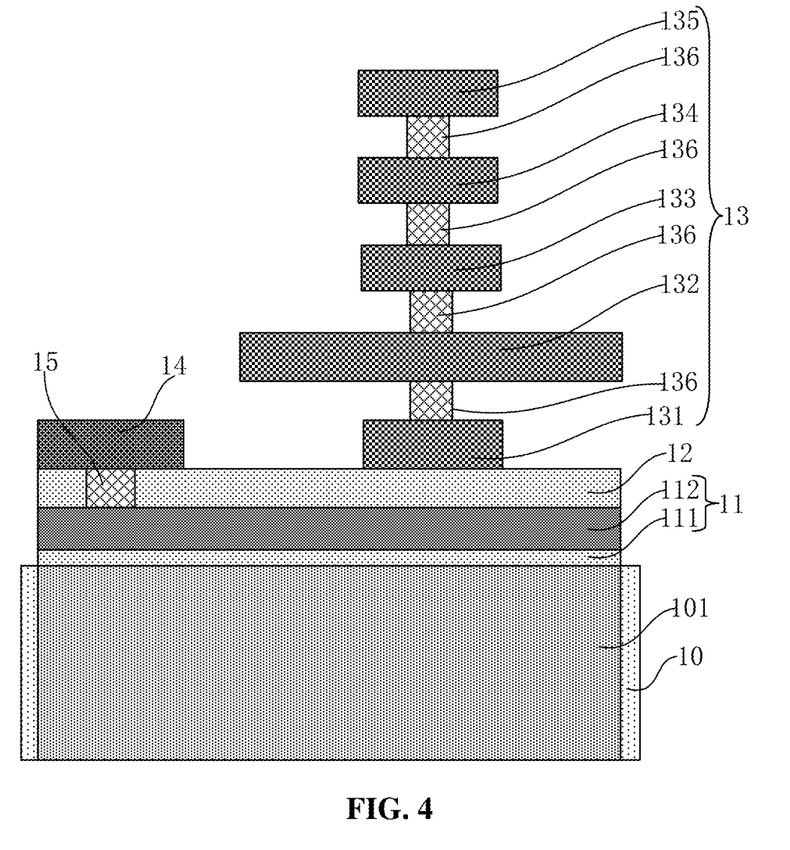
FIG. 4 is a schematic cross-sectional view of a PID structure according to a fourth embodiment of the present disclosure.
Figure 5:
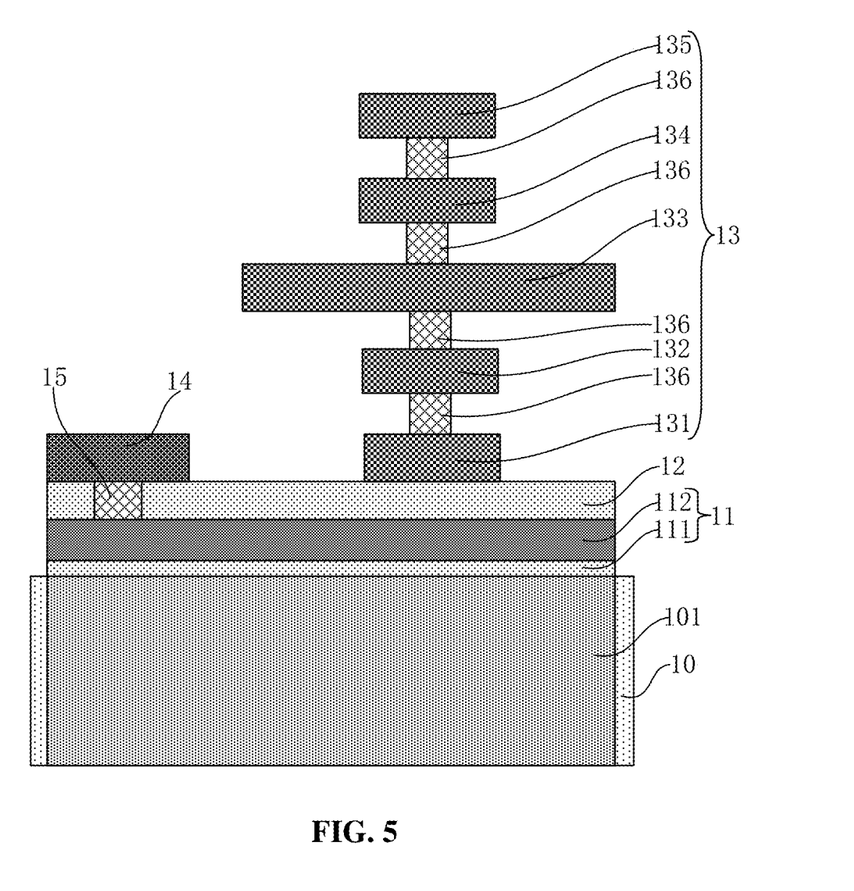
FIG. 5 is a schematic cross-sectional view of a PID structure according to a fifth embodiment of the present disclosure.
Figure 6:
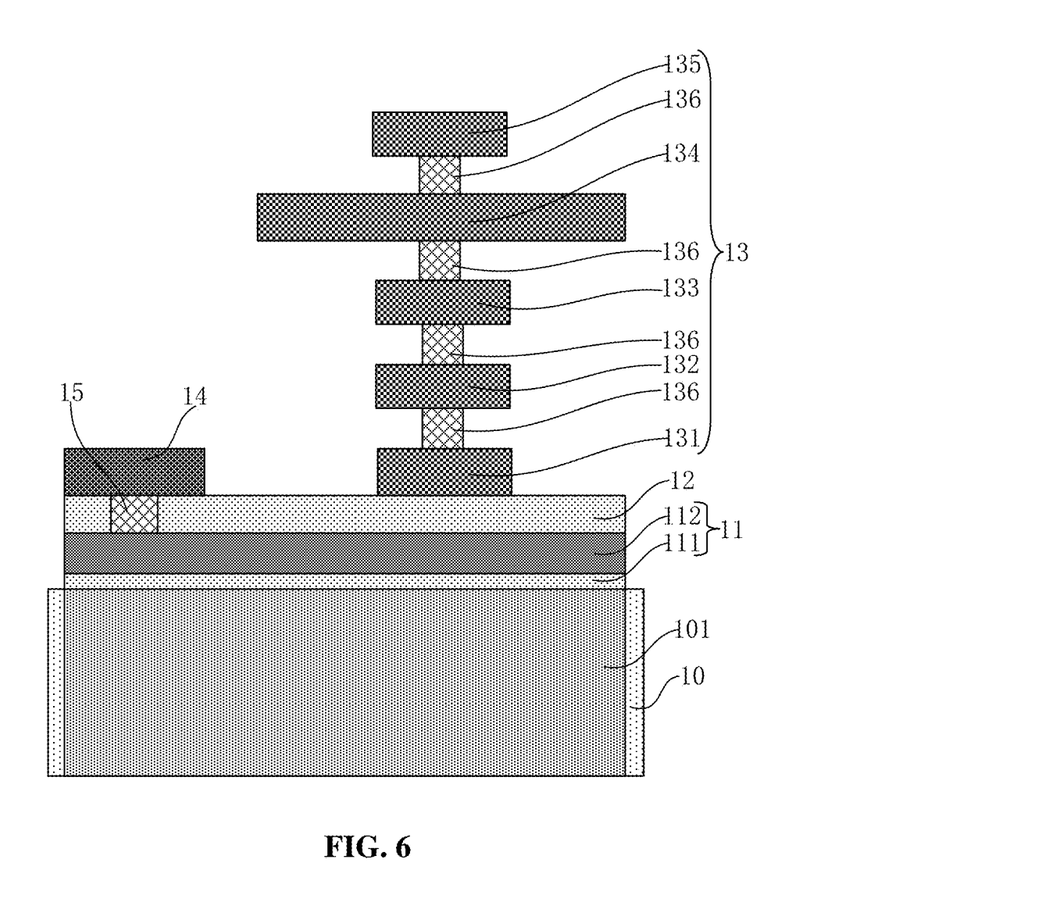
FIG. 6 is a schematic cross-sectional view of a PID structure according to a sixth embodiment of the present disclosure.
Figure 7:
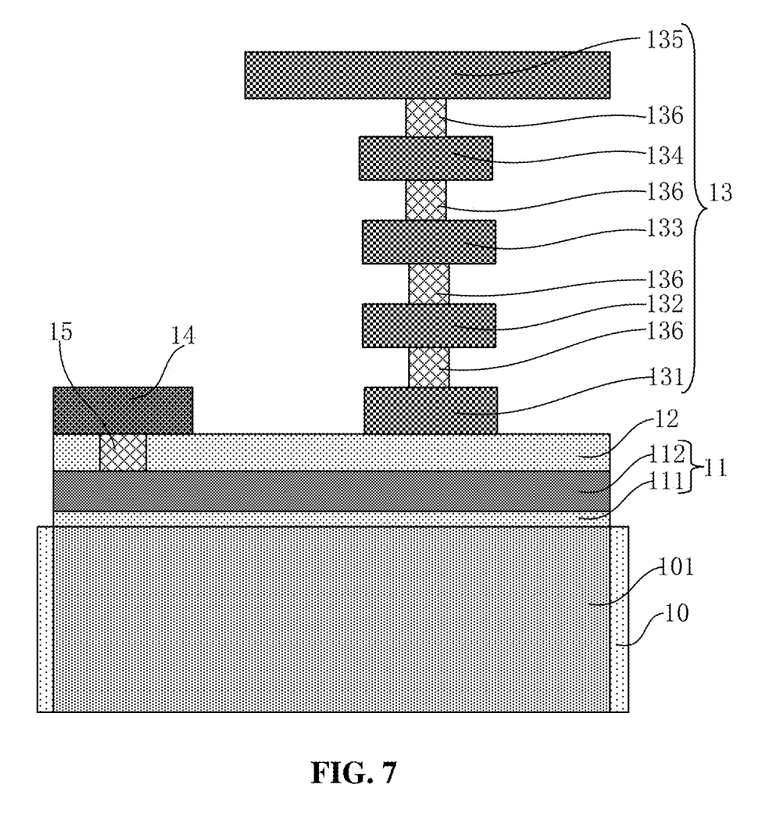
FIG. 7 is a schematic cross-sectional view of a PID structure according to a seventh embodiment of the present disclosure.
Figure 8:
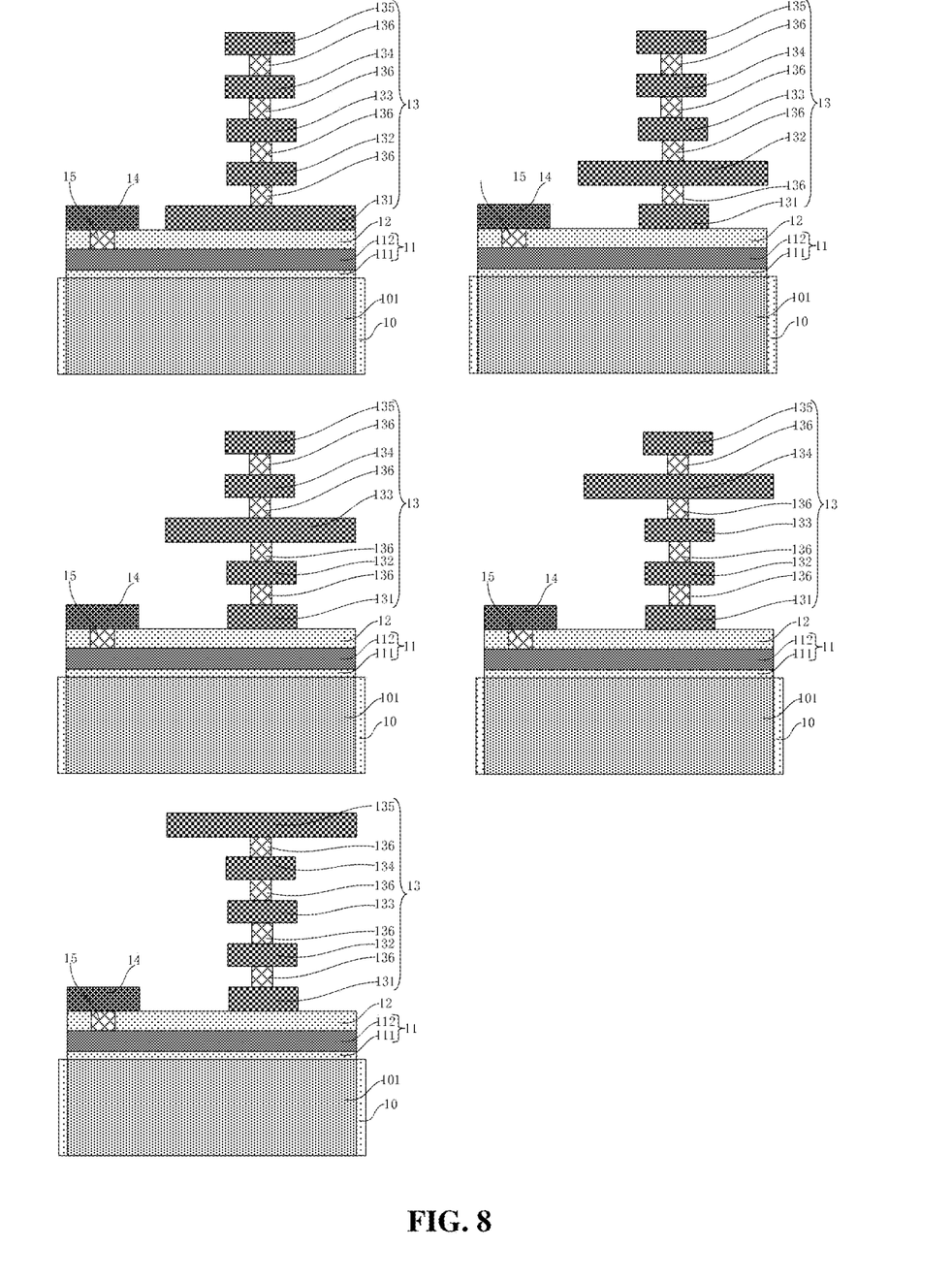
FIG. 8 is a schematic cross-sectional view of a semiconductor test structure according to an eighth embodiment of the present disclosure.

In particular, the metal layer structure 13 as shown in FIG. 1 is taken as an example, the metal layer structure in each PID test structure in the semiconductor test structure includes the lowermost metal layer 131, the first metal layer 132, the second metal layer 133, the third metal layer 134 and the fourth metal layer 135. For example, the semiconductor test structure may include five PID test structures, one of the PID test structures may be as shown in FIG. 1, and an area of the lowermost metal layer 131 is greater than that of the other metal layer. The only difference between another PID test structure and the PID test structure of FIG. 1 is that, in this PID test structure, the area of the first metal layer 132 is greater than that of the other metal layer (as shown in FIG. 4 and FIG. 8). The only difference between yet another PID test structure and the PID test structure of FIG. 1 is that, in this PID test structure, the area of the second metal layer 133 is greater than that of the other metal layer (as shown in FIG. 5 and FIG. 8). The only difference between still another PID test structure and the PID test structure of FIG. 1 is that, in this PID test structure, the area of the third metal layer 134 is greater than that of the other metal layer (as shown in FIG. 6 and FIG. 8). The only difference between yet another PID test structure and the PID test structure of FIG. 1 is that, in this PID test structure, the area of the fourth metal layer 135 is greater than that of the other metal layer (as shown in FIG. 7 and FIG. 8), that is, in the five PID test structures, the metal layers with the largest area are the lowermost metal layer 131, the first metal layer 132, the second metal layer 133, the third metal layer 134 and the fourth metal layer 135 respectively (as shown in FIG. 8). In other examples, the number of the PID test structures in the semiconductor test structure is not limited hereto. The number of the PID test structures in the semiconductor test structure may be two, three, four, six, seven or even more.

The plurality of PID test structures are arranged in the semiconductor structure, the metal layer with the largest area in each PID test structure is located at the different level from the metal layer with the largest area in the other PID test structures. In this way, the metal layers at different levels can be tested, since the metal layer with the largest area collects the most free charge.

The various technical features of the above embodiments may be combined in any combination, and in order to simplify the description, all possible combinations of the various technical features of the above embodiments are not described, however, as long as the combinations of these technical features are not contradictory, they should be considered to be within the scope of the specification.

The above examples are merely illustrative of several embodiments of the present disclosure, which are described in more detail and are not to be construed as limiting the scope of the patent of the present disclosure. It is to be noted that several variations and modifications may be made by those skilled in the art without departing from the spirit of the present disclosure, which all fall within the scope of protection of the present disclosure. Therefore, the scope of protection of the patent of the present disclosure shall be determined by the appended claims.

The invention claimed is:

1. A semiconductor test structure, comprising a plurality of Plasma Induced Damage (PID) test structures, each of the PID test structures comprises:
    a covering dielectric layer located on a surface of a gate layer;
    a metal layer structure located on a surface of the covering dielectric layer, the metal layer structure comprising a plurality of metal layers; and
    an extraction electrode electrically connected with the gate layer through a conductive structure,
wherein, in the metal layer structure of each PID test structure, the plurality of metal layers are sequentially stacked at intervals in a vertical direction, an area of one of the plurality of metal layers being greater than that of another metal layer of the plurality of metal layers, a lowermost one of the metal layers being located on the surface of the covering dielectric layer, and adjacent metal layers being electrically connected to each other via a conductive plug, and
wherein a metal layer with the largest area in each PID test structure is located at a different level from a metal layer with the largest area in other PID test structures.

* * * * *